United States Patent
Haneda

[19]
[11] Patent Number: 5,940,327
[45] Date of Patent: *Aug. 17, 1999

[54] INFORMATION TRANSMISSION SYSTEM

[75] Inventor: Naoya Haneda, Tokyo, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/751,370

[22] Filed: Nov. 19, 1996

Related U.S. Application Data

[63] Continuation of application No. 08/314,205, Sep. 28, 1994, abandoned.

[30] Foreign Application Priority Data

Sep. 30, 1993  [JP]  Japan ................................. 5-245753

[51] Int. Cl.$^6$ .............................................. G11C 13/00
[52] U.S. Cl. ..................................... 365/189.01; 365/221
[58] Field of Search ................................. 365/185, 221, 365/189.01; 360/15

[56] References Cited

U.S. PATENT DOCUMENTS

| | | | |
|---|---|---|---|
| 4,330,852 | 5/1982 | Redwine | 365/221 |
| 4,791,285 | 12/1988 | Ohki | 235/449 |
| 5,177,618 | 1/1993 | Dunlap | 360/15 |
| 5,347,484 | 9/1994 | Kwong et al. | 365/49 |
| 5,682,271 | 10/1997 | Bernardini | 360/15 |

FOREIGN PATENT DOCUMENTS

| | | | |
|---|---|---|---|
| A60055588 | 8/1985 | Japan | G11C 5/00 |
| A62093779 | 10/1987 | Japan . | |
| A1033770 | 5/1989 | Japan | G11B 19/02 |
| A2091850 | 6/1990 | Japan | G11B 19/02 |
| A3006643 | 3/1991 | Japan | G06F 12/08 |
| A3210697 | 12/1991 | Japan | G07F 17/00 |
| A4060827 | 6/1992 | Japan | G06F 3/08 |
| A4080811 | 7/1992 | Japan . | |
| A6215010 | 11/1994 | Japan | G06F 15/21 |

OTHER PUBLICATIONS

European search report dated Dec. 29, 1995, Appln. No. 94307048.2.

*Primary Examiner*—Terrell W. Fears
*Attorney, Agent, or Firm*—Limbach & Limbach L.L.P

[57] ABSTRACT

An information transfer system for transferring the information recorded on a recording medium includes a first recording medium for recording the information, a second recording medium for recording the information, a transmission unit for transmitting the information recorded on the first recording medium to the second recording medium, and a control unit for causing a writing operation on the second recording medium based upon a control signal for a readout operation from the first recording medium. The information is read out from the first information recording medium as an information transfer origin at the same time as the information is written on the second information recording medium as an information transfer destination. This makes it possible to transfer and duplicate the information at an elevated speed substantially by the readout operation only, so that the information transfer and duplication may be expedited.

20 Claims, 7 Drawing Sheets

INFORMATION TRANSMISSION SYSTEM

This is a continuation of application Ser. No. 08/314,205 filed on Sep. 28, 1994 now abandoned.

BACKGROUND OF THE INVENTION

This invention relates to an information transmission system suitably employed for transmitting the information, such as the news or music, recorded on a first recording medium, to a second recording medium at an elevated velocity.

In the information transmission system, employed for transmitting information, such as the news or music, recorded on a first recording medium, to a second recording medium at an elevated velocity, the information recorded on the first recording medium, as a transfer origin, is read once and subsequently recorded on the second recording medium, as a transfer destination, so that the operation for reading out the information from the transfer origin and writing the information at the transfer destination is necessitated.

In a personal computer, a typical device having such conventional information transfer means, data transfer from a hard disc to a floppy disc is accomplished by reading out data from a hard disc on the basis of a pre-set size block, temporarily recording the data in a separate buffer and writing the data from the buffer memory to the floppy disc. That is, the data is transferred from the hard disc to the floppy disc via the buffer memory.

If, while the information such as the news or the music is recorded from the first recording medium to the second recording medium, using the above-described conventional information transfer device, it is desired to record the information on a third recording medium or further on to one or more other recording medium, it is necessary to await the end of recording of the desired information on the second recording medium and subsequently to record the information on the third recording medium or further on to one or more other recording medium.

However, if it becomes necessary to make divisional recording of the voluminous information, such as the news or the music, on plural recording media, the time required in recording all of the desired information is necessarily increased. Such inconvenience is similarly felt when it becomes necessary to duplicate the same information in large quantities on plural recording media.

Thus, when it is desired to record the information on another recording medium, with the use of the conventional information transfer device, the time necessary for such an information transfer poses a problem, so that it is not possible for the conventional information transfer device to cope with the demand for divisionally recording voluminous information or duplicating the same information on plural recording media.

OBJECT AND SUMMARY OF THE INVENTION

It is therefore an object of the present invention to provide an information transfer device capable of speedily transferring or recording various types of the information.

According to the present invention, there is provided an information transfer system for transferring information recorded on a recording medium. The information transfer system includes a first recording medium for recording the information thereon, a second recording medium for recording the information thereon, transmission means for transmitting the information recorded on the first recording medium to the second recording medium, and control means for causing a writing operation on the second recording medium based upon a control signal for a readout operation from the first recording medium.

According to the present invention, there is also provided an information transfer device for transferring information recorded on a recording medium. The information transfer device includes a first recording medium for recording the information thereon, transmission means for transmitting the information recorded on the first recording medium to an external recording medium having a second recording medium, and control means for causing a writing operation on the second recording medium based upon a control signal for a readout operation from the first recording medium.

According to the present invention, the information is read out from the first information recording medium (the information transfer origin) at the same time as the information is written on the second information recording medium (the information transfer destination). This makes it possible to transfer and duplicate the information at an elevated speed substantially by the readout operation only. In addition, the operation of updating the readout position from the first information recording medium and the operation of updating the write position on the second information recording medium are also performed simultaneously to make possible the information transfer at a higher speed.

DESCRIPTION OF THE PREFERRED EMBODIMENTS

Figure 1:
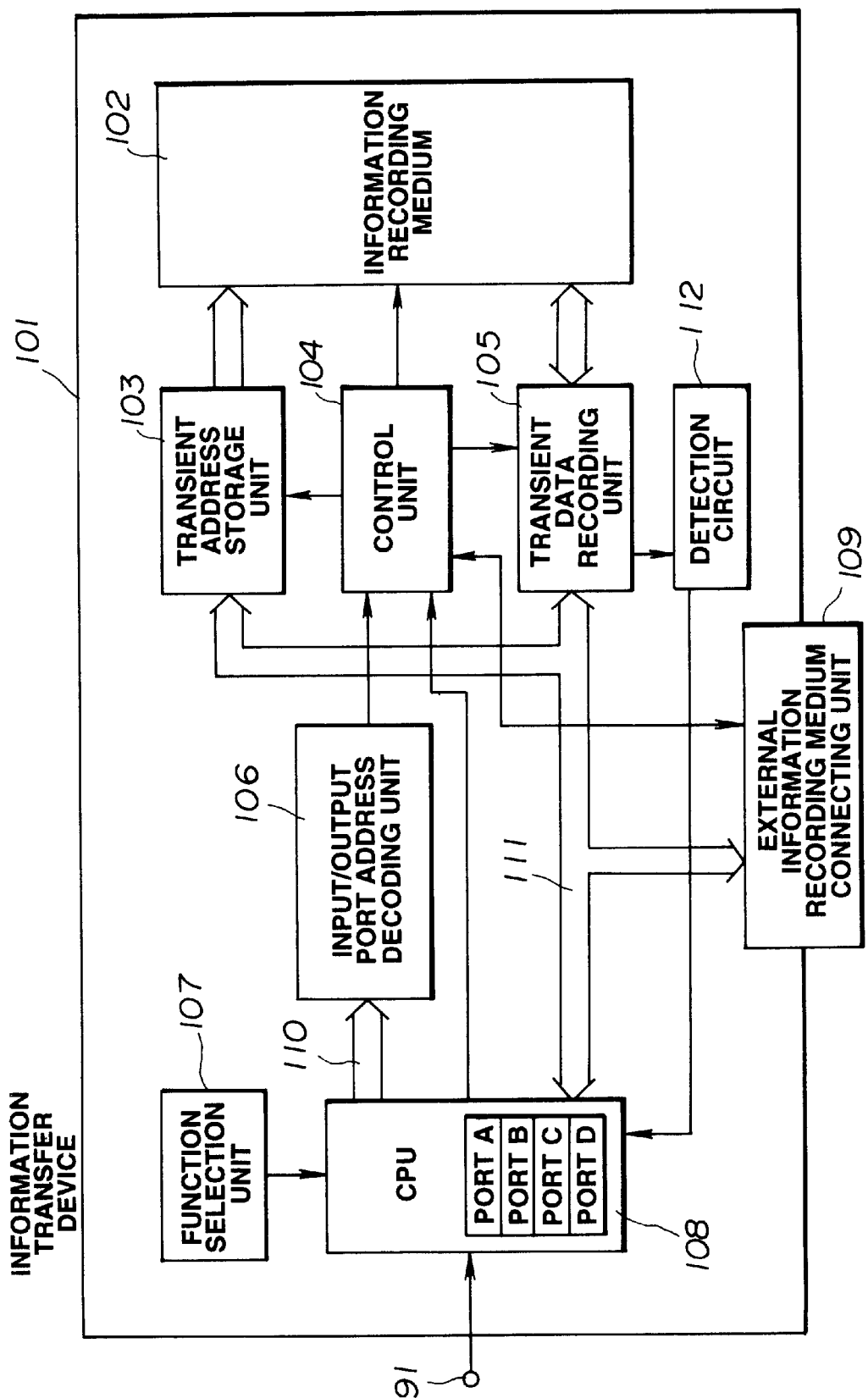
FIG. 1 is a schematic block circuit diagram showing an information transfer device according to the present invention.

Referring to the drawings, preferred embodiments of the present invention will be explained in detail.

Reference is first made to FIG. 1 illustrating the schematic arrangement of an information transfer device 101.

In the information transfer device 101, a CPU 108 is in operation based on the function selection information from a function selection unit 107 for selecting the recording or the transfer of the information in an optional area within an information recording medium 102 comprised of a semiconductor memory.

If the recording function is selected, the CPU 108 determines a recording address in the information recording medium 102 in which to record the input information supplied thereto from outside via an input terminal 91, and transfers the recording address to a transient address recording unit 103 over a data line 111 using an input/output port address decoding unit 106 and a control unit 104. Besides, the CPU 108 transmits the input information to a transient data recording unit 105 over the data line 111 using the input/output port address decoding unit 106 and the control unit 104. There is no particular limitation to the width of the data line 111.

The CPU 108 then causes the control unit 104 as later explained to read out the input information and the recording address from the transient data recording unit 105 and from the transient address recording unit 103, respectively, and to transmit the input information and the recording address to the information recording medium 102 in order to start recording of the input information on the information recording medium 102.

If the transfer function is selected, the CPU 108 determines the transfer origin address in the information recording medium 102 which is to be the transfer origin of the transfer information, and transmits the transfer origin address to the transient address recording unit 103. In addition, the CPU 108 determines the transfer destination address in an information recording medium 202 (non-volatile memory) of an external information recording medium 201 (transfer destination) shown in FIG. 2. The external information recording medium 201 will be explained subsequently. Besides, the CPU 108 transmits the address of the transfer destination to an external information recording medium connecting unit 109 over the data line 111 using the input/output port address decoding unit 106 and the control unit 104.

The CPU 108 causes the control unit 104 to fetch the information from the information recording medium 102 and to transfer the information via the transient data recording unit 105 and the external information recording medium connecting unit 109.

The control unit 104 transmits a control signal to the information recording medium 102, transient address recording unit 103 and to the transient data recording unit 105, based upon the signal from the CPU 108 and the signal from the input/output port address decoding unit 106. This causes the control unit 104 to record the information entered from outside the device 101 via the input terminal 91 on the information recording medium 102. Alternatively, the control unit 104 transmits the control signal to the external information recording medium 201 via the external information recording medium connecting unit 109 in order to transfer the information fetched from the information recording medium 102 to the external information recording medium 201. A detection circuit 112 detects when transfer of data of a pre-set volume from the transient data recording unit 105 has come to a close, or that the transfer data is a transfer end code, and routes a transfer end signal to the CPU 108.

It is also possible to provide the information transfer device 101 with an external recording function by directly recording the input information applied from outside to the device 101 on the external information recording medium 201 responsive to the function selection unit 107. In this case, the CPU 108 determines the recording address in the information recording medium 202 in which to record the input information from outside the device 101, as in the case of selection of the recording function described above. Using the input/output port address decoding unit 106 and the control unit 104, the CPU 108 transmits the recording address to a transient address recording unit 203, as later explained, via the external information recording medium connecting unit 109. Besides, using the input/output port address decoding unit 106 and the control unit 104, the CPU 108 transmits the input information to a transient data recording unit 204, as later explained, via the external information recording medium connecting unit 109, and subsequently causes the control unit 104 to start the recording.

The construction of the information recording medium may be changed from that described above, so that, for example, address and data may be entered time-divisionally on the same line. A device modified to effect such a change may naturally be encompassed by the present invention.

Figure 2:
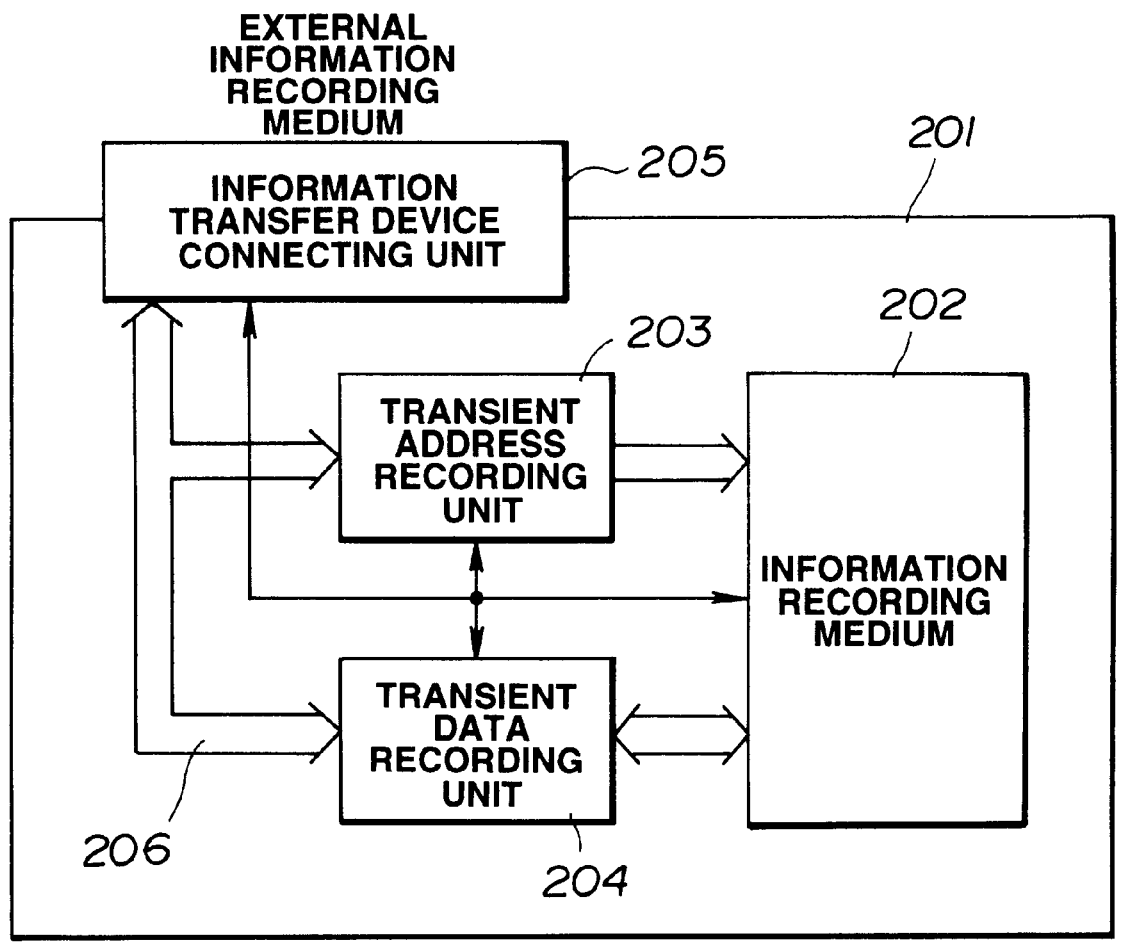
FIG. 2 is a schematic block circuit diagram showing an external information recording medium according to the present invention.

FIG. 2 shows a schematic arrangement of the external information recording medium, comprised of an IC card, that is, an external information recording device 201, according to the present invention.

The external information recording medium 201, shown in FIG. 2, is connected to the external information recording medium connecting unit 109 of the information transfer device 101 at an information transfer device connecting unit 205, at which exchange of data inclusive of address data and control signals is made. That is, when the recording medium 201 is connected to the information transfer device 101, and the transfer function is selected by the information transfer device 101, the transfer destination address appears on a data line 206 via the information transfer device connecting unit 205. The transfer destination address is held on the transient address recording unit 203, with the aid of the control signal, transmitted simultaneously. The transfer information, transmitted subsequently, is recorded on the information recording medium 202 via a transient data recording unit 204, with the aid of the control signal, transmitted simultaneously with the transfer information. There is no particular limitation to the width of the data line 206.

The transient address recording unit 203 and the transient data recording unit 204 may alternatively be arranged within the information transfer device 101, while the transient address recording unit 203 and the transient data recording unit 204 may also be arranged in the transient address recording unit 103 and in the transient data recording unit 105, respectively, thereby simplifying the external information recording medium 201.

It is noted that connection of the external information recording medium connecting unit 109 to the information transfer device connecting unit 205 may be performed by a connector or the like by way of contact transfer. Alternatively, non-contact transmission, such as light transmission, may also be employed.

Figure 3:
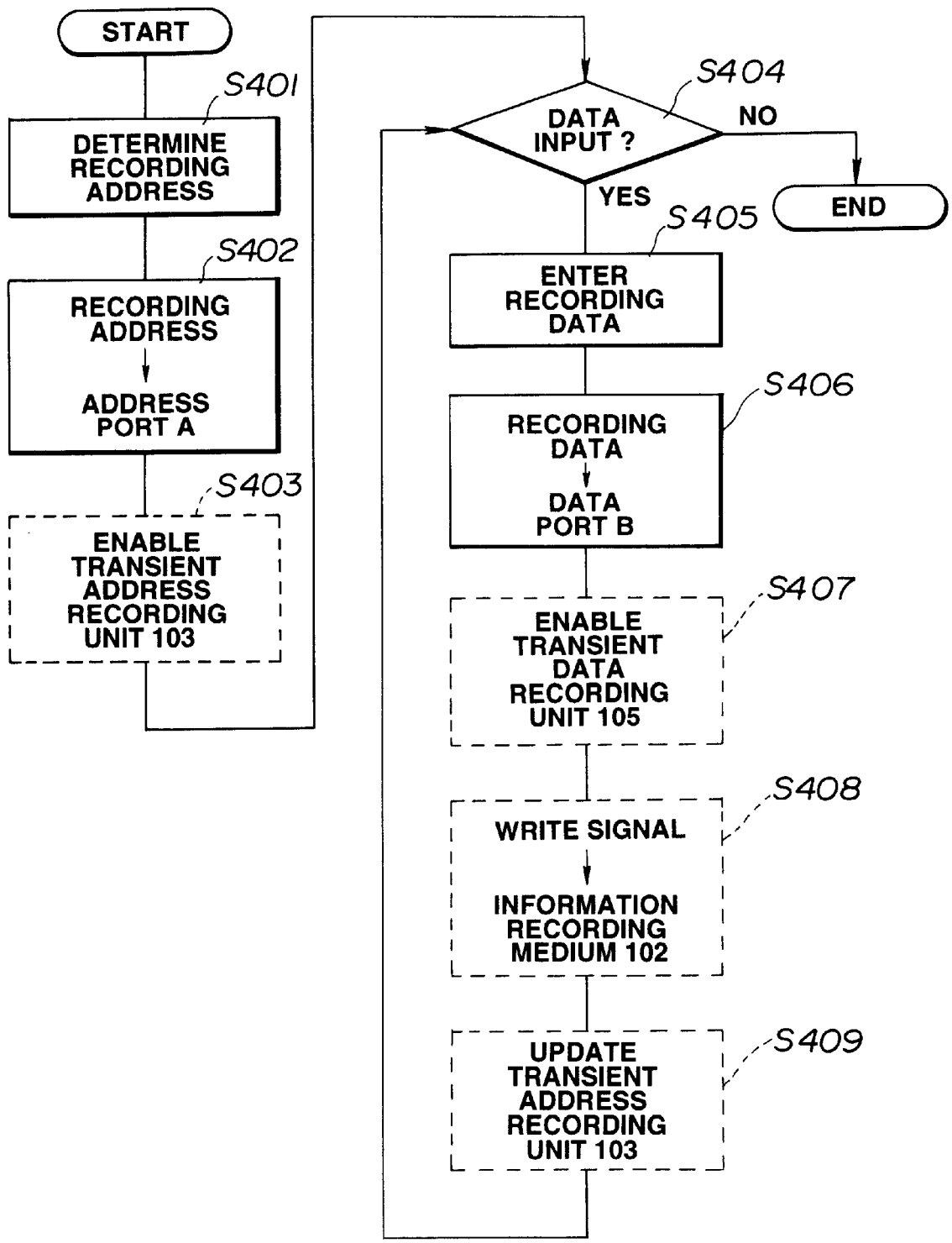
FIG. 3 is a flow chart showing the operational sequence in the CPU and control means in the information transfer device of the preset invention when the recording is selected.

Referring to the flow chart of FIG. 3, the operational sequence by the CPU 108 and the control unit 104 when the recording function is selected at the information transfer device 101 is now explained. In the flow chart of FIG. 3, steps indicated by solid line blocks and broken-line blocks indicate the processing by the CPU 108 and that by the control unit 104, respectively.

Referring to the flow chart of FIG. 3, the address in the information recording medium 102 as the recording destination in which to record the information is determined at a step S401 which represents the starting time of recording control operation for the information recording medium 102. In this case, it becomes possible to search for and locate a vacant area in the recording medium 102, if a control area indicating the use state in the recording medium 102 is provided within the information transfer device 101 and reference is had to this control area. If the information inclusive of that on the control area is entered from outside the information transfer device 101, it also becomes possible to designate the leading address of the recording medium 102. In addition, it becomes possible to designate the recording address simultaneously with selection of the recording function by the function selecting unit 107.

At the next step S402, the recording address as determined at the step S401 is outputted on the data line 111 via an address port A which is an address port for the information recording medium 102. Simultaneously, the input/output address of the address port is decoded by the input/output address decoding unit 106. At the next step S403, the control unit 104 enables the transient address recording unit 103 based on the decoding signal. This causes the recording address appearing on the data line 111 to be held by the transient address recording unit 103.

At the next step S404, a data input from outside the information transfer device 101 is detected by interrupt and, for example it is determined whether or not the input data is an input end code is determined. If it is found at the step S404 that there is no data input, the program comes to a close. If it is found that there is data input, the program proceeds to a step S405.

At the step S405, the input recording data is fetched to the CPU 108.

At the next step S406, the recording data entered at the previous step S405 is outputted on the date line 111 at a data port B which is a data port for the information recording medium 102. Simultaneously, the input/output address of the data port is decoded by the input/output port address decoding unit 106. At the next step S407, the control unit 104 enables the transient data recording unit 105 based on the decoding signal. This holds the recording data appearing on the data line 111 on the transient data recording unit 105. At the next step S408, a write signal for writing on the information recording medium 102 is generated for recording the input recording data at the recording address on the recording medium 102.

At the next step S409, the contents of the transient address recording unit 103 are updated by the control unit 104, using a counter or the like, for setting the recording address for the next input data. The program then reverts to the step S404 by way of repeating the above-mentioned sequence of operations until the data entry comes to a close.

Figure 4:
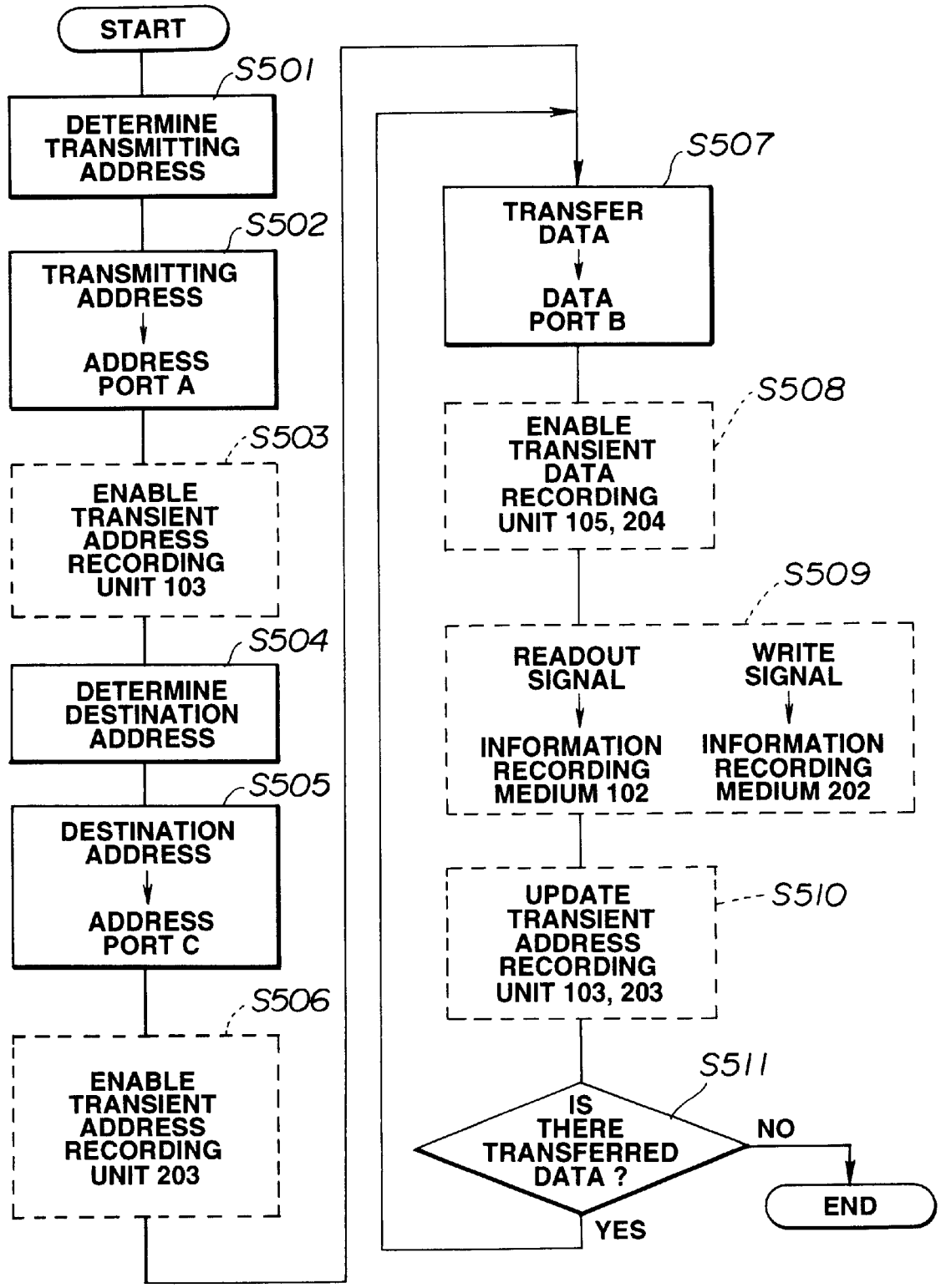
FIG. 4 is a flow chart showing the operational sequence in the CPU and control means in the information transfer device of the present invention when the transfer is selected.

Referring to the flow chart shown in FIG. 4, the operating sequence in the CPU 108 and the control unit 104 at the time of selecting the transfer function at the information transfer device 101 is explained. In the flow chart of FIG. 4, similarly to the flow chart of FIG. 3, steps indicated by solid line blocks and broken-line blocks indicate the processing by the CPU 108 and that by the control unit 104, respectively.

At a step S501 of the flow chart of FIG. 4, which indicates the start time of the transfer control from the information recording medium 102 in the information transfer device 101 to the information recording medium 202 in the external information recording medium 201, the transfer origin address recording the information to be transferred from the recording medium 102 is determined. The transfer origin address may also be determined simultaneously with selection of the transfer function by the function selection unit 107.

At the next step S502, the transfer origin address as determined at the step S501 is outputted on the data line 111 at an address port A which is an address port for the information recording medium 102. Simultaneously, the input/output address for the address port is decoded by the input/output address decoding unit 106. At the next step S503, the control unit 104 enables the transient address recording unit 103, based upon the decoding signal. This holds the address of the transfer origin appearing on the data line 111 on the transient address recording unit 103.

At the next step S504, the address of the transfer destination, in which to record the information to be transferred to the recording medium 202, is determined. It is also possible to designate the address of the transfer destination simultaneously with selection of the transfer function at the function selecting unit 107. It is also possible to provide a control area indicating the use state of the recording medium 202 in the external information recording medium 201 and to make reference to the control area in order to search for and determine the vacant area in the recording medium 202. If the information inclusive of that on the control area is to be transferred from the recording medium 102, it is also possible to designate the leading address of the recording medium 202.

At the next step S505, the address of the transfer destination determined at the step S504 is outputted to the data line 111 from an address port C which is an address port for the information recording medium 202. Simultaneously, the input/output address of the address port is decoded by the input/output address decoding unit 106. At the next step S506, the control unit 104 enables the transient address recording unit 203 via the external information recording medium connecting unit 109 and the information transfer device connecting unit 205 based upon the decoding signal. This holds the address of the transfer origin appearing on the data line 206 on the transient address recording unit 203.

At the next step S507, the CPU 108 attempts to fetch the transfer data from the data port B for the information recording medium 102. This causes the input/output address of the data port to be decoded by the input/output port address decoding unit 106. At the next step S508, the control unit 104 enables the transient data recording unit 105 and the transient data recording unit 204 based upon the decoding signal. Simultaneously, the readout signal from the recording medium 102 and the write signal to the recording medium 202 are generated at the next step S509, whereby the transfer data appearing on the data line 111 via the transient data recording unit 105 is transferred via the external information recording medium connecting unit 109 to the external information recording medium 201.

The most important feature of the present invention resides in that the steps concerning data in the external information recording medium 210 (the transfer destination) which would otherwise be necessary downstream of the step S510. For example, steps such as outputting from a data port D (a data port for the information recording medium 202 for the transfer data), generation of enabling signals for the transient data recording means 204 or generation of write signals on the information recording medium 202, may be substantially eliminated, thereby assuring more prompt data transfer. The principle of the above features will be explained subsequently.

At the next step S510, the contents of the transient address recording unit 103 and the transient address recording unit 203 are updated by the control unit 104, using, for example, a counter. At the next step S511, the CPU 108 determines the presence or absence of the transfer data based upon the presence or absence of the transfer end signal from the detection circuit 112. If it is found that there is no transfer data, the program comes to a close. If otherwise, the program reverts to the step S507 to repeat the above sequence until data transfer comes to a close.

Another important feature of the present invention is that the step relating to the address in the external information recording medium 201, a transfer destination, which would otherwise be necessary downstream of the step S511, such as updating of the transient address recording means 203, may be substantially eliminated, thus enabling more prompt data transfer. This additional feature will be discussed subsequently in detail.

These two features of the present invention may be realized separately, such that one or both of them may be selected by the function selection means 107.

These important features of the present invention will be explained with reference to the block circuit diagrams of FIGS. 5A and 5B. The signals shown in these figures are assumed to be active at a low (zero) level.

Figure 5A:
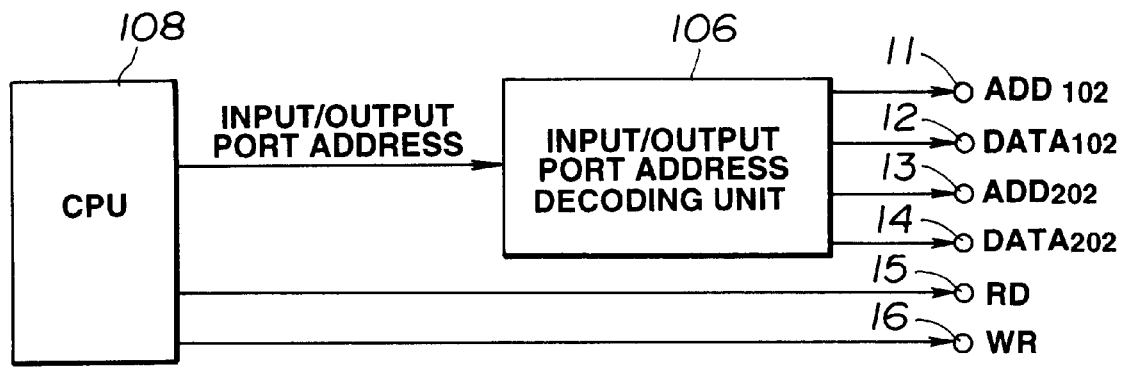
FIGS. 5A and 5B are a block circuit diagrams showing detailed construction of the CPU, input/output port address decoding means and control means of the control signal generating circuit in the information transfer device of the present invention.
Figure 5B:
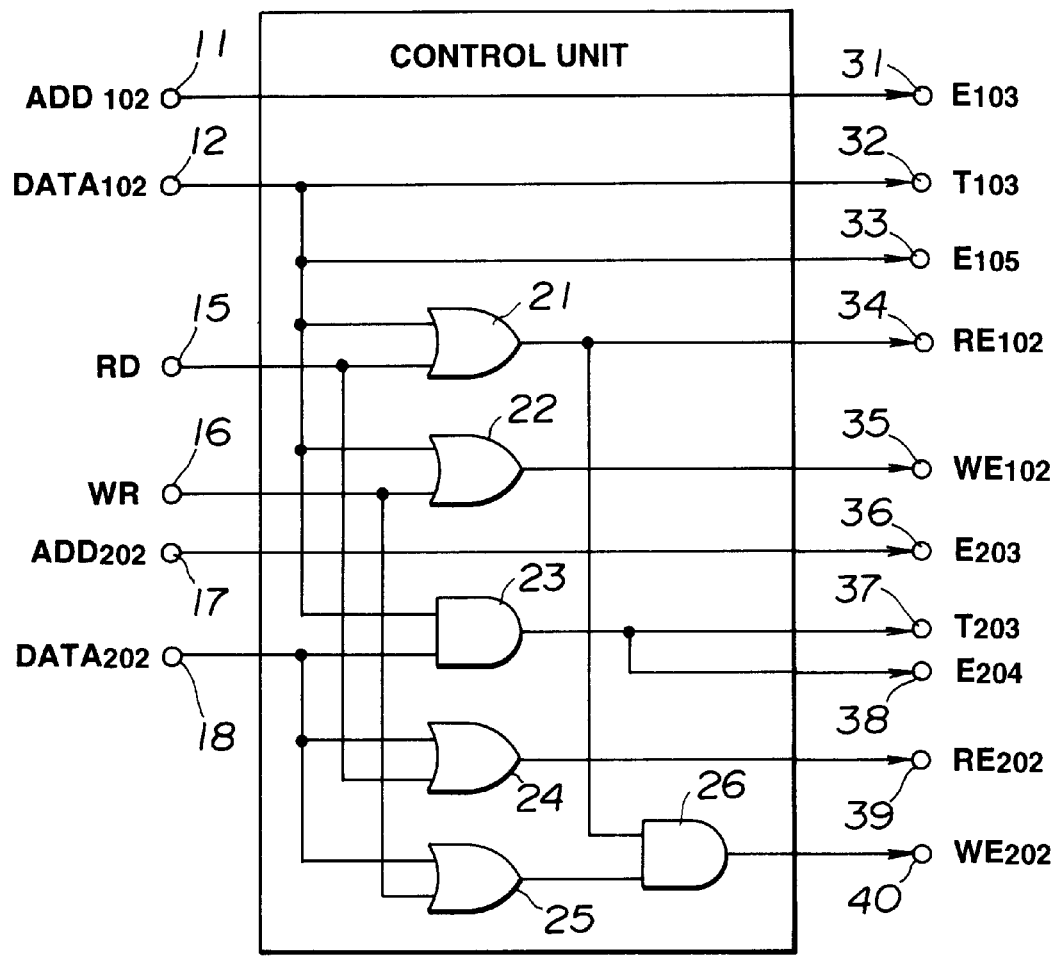

FIG. 5A shows the CPU 108 and the input/output port address decoding unit 106, and FIG. 5B shows the control unit 104.

Referring to FIG. 5, the CPU 108 shown in FIG. 5a outputs an input/output port address to the input/output port address decoding unit 106, while outputting a readout signal RD and a write signal WR to the control unit 104 of FIG. 5B via terminals 15 and 16, respectively.

The input/output port address decoding unit 106 outputs an address port selection signal $ADD_{102}$, indicating that the address port A for the recording medium 102 has been selected, a data port selection signal $DATA_{102}$, indicating that the data port B for the recording medium 102 has been selected, an address port selection signal $ADD_{202}$, indicating that the address port C for the recording medium 202 has been selected, and a data port selection signal $DATA_{202}$, indicating that the data port D for the recording medium 202 has been selected. These signals are outputted to the control unit 104 shown in FIG. 8B at associated terminals 11, 12, 13 and 14, respectively.

The control unit 104 shown in FIG. 5B is fed with the readout signal RD and the write signal WR outputted from the CPU 108. The control unit 104 includes a two-input OR (logical sum) gate 21, having as inputs the data port selection signal $DATA_{102}$ and the readout signal RD. The control unit 104 further includes a two-input OR (logical sum) gate 22, having as inputs the data port selection signal $DATA_{102}$ and the write signal WR. The control unit 104 further includes AND (logical product) gate 23, having as inputs the data port selection signal $DATA_{102}$ and the data port selection signal $DATA_{202}$. The control unit 104 further includes a two-input OR gate 24 having as inputs the data port selection signal $DATA_{202}$ and the readout signal RD. The control unit 104 further includes two-input OR gate 25 having as inputs the data port selection signal $DATA_{202}$ and the write signal WR. The control unit 104 further includes a two-input AND gate 26 having as inputs the outputs of the OR gates 21 and 25. From the control unit 104, the address port selection signal $ADD_{102}$ via the terminal 11 is outputted via a terminal 31 as an enabling signal $E_{103}$ for the transient address recording unit 103. Similarly, the data port selection signal $DATA_{102}$ via the terminal 12 is outputted via a terminal 32 as an updating signal $T_{103}$ for the transient address recording unit 103, while being outputted at a terminal 33 as an enabling signal $E_{105}$ for the transient data recording unit 105. The address port selection signal $ADD_{202}$ via the terminal 17 is outputted via a terminal 36 as an enabling signal $E_{203}$ for the transient address recording unit 203. In addition, from the control unit 104, an output of the OR gate 21 is outputted via a terminal 34 as a readout signal $RE_{102}$ for the recording medium 102 via a terminal 34, while an output of the OR gate 22 is outputted via a terminal 35 as a write signal $WE_{102}$ for the recording medium 102 via a terminal 35. Similarly, an output of the AND gate 23 is outputted via a terminal 37 as an updating signal $T_{203}$ for the transient address recording unit 203, while being outputted via a terminal 38 as an enabling signal $E_{204}$ for the transient data recording unit 204. An output of the OR gate 24 is outputted via a terminal 39 as a readout signal $RE_{202}$ for the recording medium 202, and an output of the AND gate 26 is outputted at a terminal 40 as a write signal $WE_{202}$ for the recording medium 202.

Referring to the flow chart of FIG. 4, the operation of the block circuit diagram shown in FIGS. 5A and 5B is now explained.

At a step S507 in FIG. 4, the data port selection signal $DATA_{102}$ for the recording medium 102 is activated from the input/output port address decoding unit 106. Accordingly the enabling signal $E_{105}$ for the transient data recording unit 105 from the control unit 104 is activated. At the next step S508, the transient data recording unit 105 is validated. Simultaneously, the enabling signal $E_{204}$ for the transient data recording unit 204, an output of the AND gate 23, is activated, so that the transient data recording unit 204 is validated. The updating signals $T_{103}$ and $T_{203}$ are also activated.

At the next step S509, the CPU 108 activates the readout signal $RE_{102}$ of the recording medium 102, at the same time as the write signal $WE_{202}$ for the recording medium 202, an output of the AND gate 26, is also activated. This substantially eliminates the steps otherwise executed within the external information recording medium 201, a transfer destination, hitherto required to be performed downstream of the step S509, namely a step (hypothetically termed a step S508') of outputting the transfer data at the data port D, a data port for the information recording medium 202, a step (hypothetically termed a step S509') of generating the enabling signal $E_{204}$ from the transient data recording unit 204, and a step (hypothetically termed a step S510') of generating the write signal $WE_{202}$ for the information recording medium 202, thereby expediting the data transfer operation.

At the next step S511, the contents of the transient address recording unit 103 are updated by inactivation of the updating signal $T_{103}$ of the transient address recording unit 103, at the same time as the contents of the transient address recording unit 203 are updated by inactivation of the transient address recording unit 103. This eliminates the steps to be executed within the external information recording medium 201, a transfer destination, hitherto required to be performed downstream of the step S511, namely a step (hypothetically termed a step S511') of updating the transient address recording unit 203, thereby expediting the data transfer operation.

The logic circuit components shown in FIG. 5B, such as OR or AND gates, are merely illustrative and may be replaced by circuit components having equivalent functions without departing from the scope of the present invention.

The above-mentioned operation is now explained with reference to a timing chart shown in FIG. 6. In this timing chart are shown the data port selection signal $DATA_{202}$ and the readout signal RD for the recording medium 102.

At an instant when the data port election signal $DATA_{102}$ of the recording medium 102 is activated at a timing $t_{508}$ at the step S508, the steps S509 and S509' are executed at timings $t_{509}$ and $t_{509}'$, respectively, for validating the transient data recording units 105 and 204.

Figure 6:
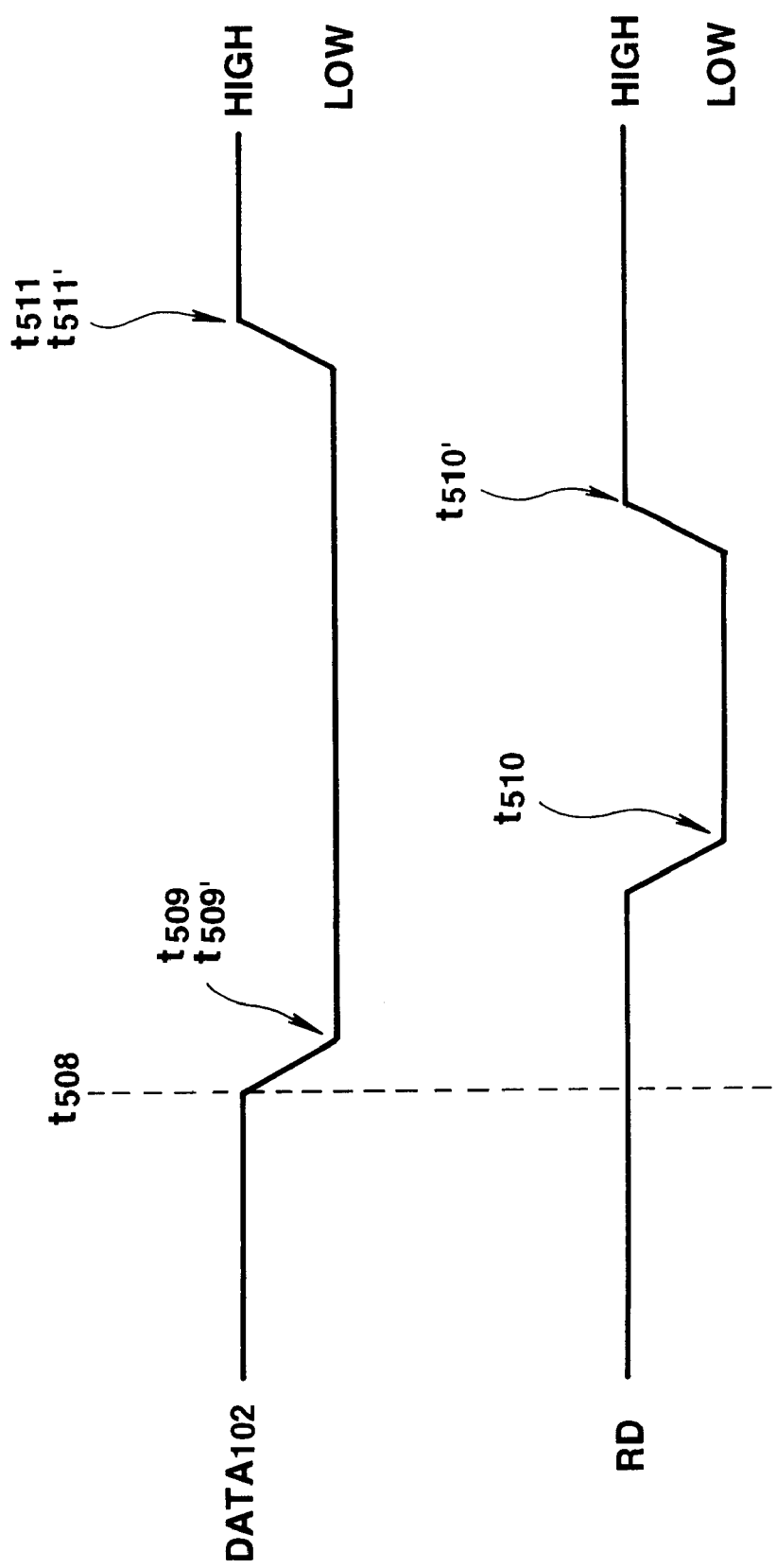
FIG. 6 is timing chart for information transfer in the information transfer device of the present invention.

When the readout signal RD is changed from logically high to logically low, the step S510 is executed at a timing $t_{510}$ in FIG. 6, so that data readout from the information recording medium 102 is started. The data thus read out appears on the data bus 111 via the validated transient data recording unit 105. The data further appears on the data line 206 via the information transfer/recording reproducing device connecting unit 205 in the external information recording medium connecting means 109 and the external information recording medium 201 so as to be supplied to the information recording medium 202 via the transient data recording unit 204. As the readout signal is changed from the logically low to the logically high, the step S510' is executed at a timing $t_{510}'$, so that data thus read out is written on the information recording medium 202.

Finally, at a time instant when the data port selection signal of the recording medium 102 is inactivated at timings $t_{511}$ and $t_{511}'$, the steps S511, S511' are executed for updating the transient address recording unit 103 and the transient address recording unit 203. Thus, data transfer from the information recording medium 102 to the information recording medium 202 may be performed by one command.

Figure 7:
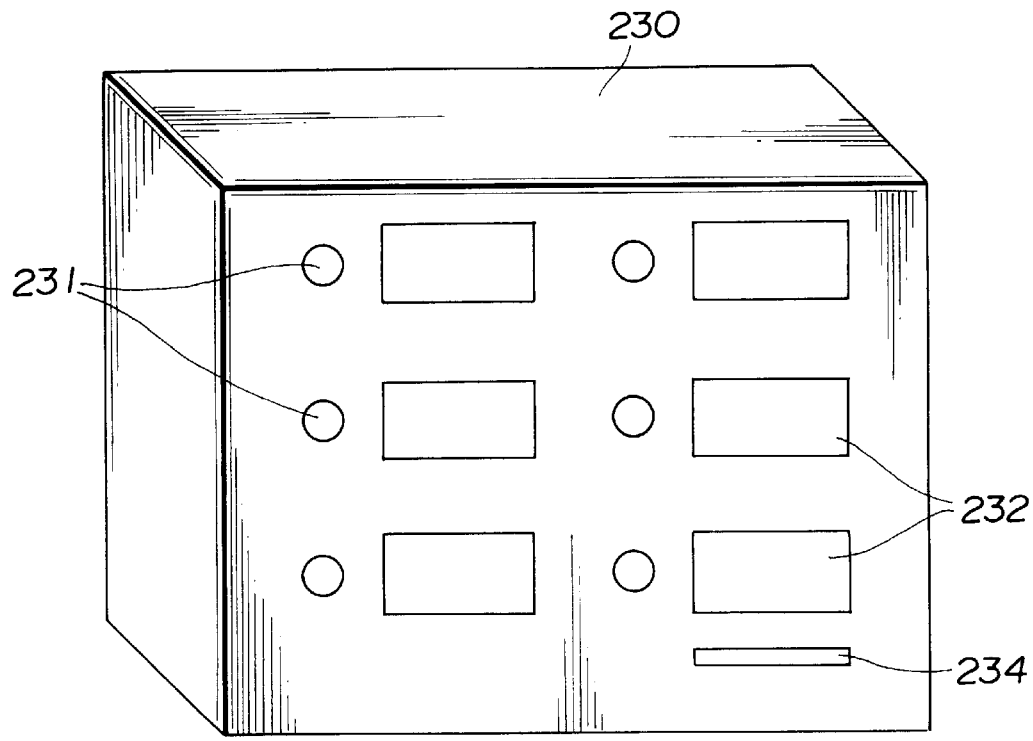
FIG. 7 is a perspective view showing the information transfer device according to the present invention.

FIG. 7 is a perspective view showing an information transfer device 230 employing the above technique.

In FIG. 7, the recording medium, carrying the information recorded thereon, is installed within an information transfer device 230. Although not shown in FIG. 7, the information to be recorded may conveniently be transmitted by wired or radio information transmission means. Of course, the prerecorded recording medium may be directly inserted in the device 230. The device 230 shown in FIG. 7 includes a display unit 232 for displaying the contents, pricing or the like of the recorded information and an output selecting unit 231 for selecting which information is to be outputted from the information transfer device 230. The information may be procured by inserting an information recording reproducing device or an external information recording medium by the user into an insertion/ejection opening 234 of the information transfer device 230 by way of requesting and receiving a copy.

Figure 8:
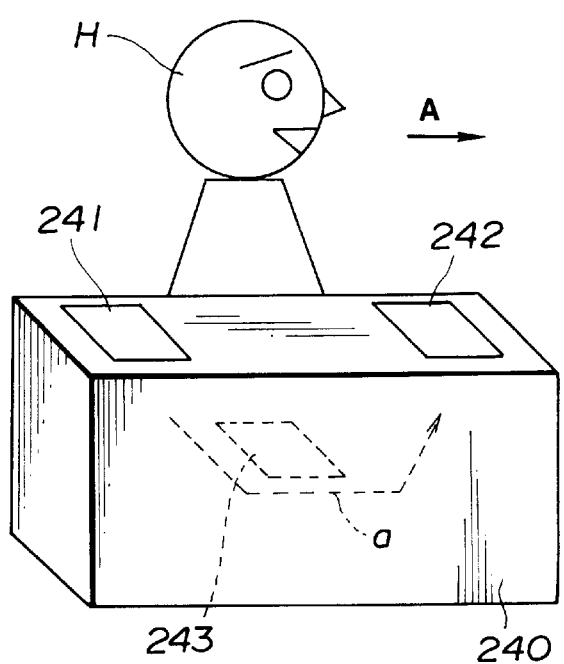
FIG. 8 is another perspective view showing the information transfer device according to the present invention.

FIG. 8 is a perspective view showing an information transfer device 240 according to a modification employing the above technique. With the present modification, an insertion opening 241 is separated apart from an ejection opening 242. A portable recording medium 243, inserted at the inserting opening 241, is moved by movement means, not shown, within the device 240, in a direction a in FIG. 8, as the information is copied on the portable information recording medium 243. The copy thus produced is subsequently ejected via an ejection opening 242. A person H desiring to get the information may have the copy produced as he or she walks in the direction A in FIG. 8. The present modification is convenient in affording the information promptly to many persons desiring to get copies.

Although there is no limitation to the types of the external information recording medium 201, it is preferably a semiconductor memory, such as a flash memory, which lends itself to high speed duplication and which is excellent in portability and facility in random accessing. The contents of the transfer data may be any of the text information, speech information, picture information or computer programs.

Although the foregoing description has been made of data transfer from the information recording medium 102 to the information recording medium 202, the present invention may be applied to the data transfer from the information recording medium 202 to the information recording medium 102 as well.

What is claimed is:

1. An information transfer system for transferring information recorded on a recording medium, comprising:

a first recording medium for recording the information thereon;

a second recording medium for recording the information thereon, the second recording medium provided separately from the first recording medium;

transmission means for transmitting the information recorded on the first recording medium to the second recording medium, a central processing unit for determining a readout address in the first recording medium and a write address in the second recording medium and for providing a control signal;

first transient address recording means for transiently recording the readout address for the first recording medium;

second transient address recording means for transiently recording the write address for the second recording medium; and control means for receiving the control signal and in accordance therewith simultaneously generating a readout signal for the first recording medium and a write signal for the second recording medium, wherein information is read out from the first recording medium at the same time as the information is written on the second recording medium, thereby rapidly transferring the information via the transmission means, from the first recording medium to the second recording medium, wherein the transmission means receives the information in response to the readout signal, and wherein the second recording medium receives the information transferred from the transmission means in response to the write signal, and wherein the control means updates the readout address for the first recording medium and the write address for the second recording medium.

2. The information transfer system as claimed in claim 1 wherein the second recording medium is provided separately from the control means.

3. The information transfer system as claimed in claim 1 wherein the first recording medium is provided separately from the control means.

4. The information transfer system as claimed in claim 1 wherein the readout signal for the first recording medium and wherein the write signal for the second recording medium are based upon the readout signal for the first recording medium.

5. The information transfer system as claimed in claim 1 further comprising:

first transient address recording means for transiently recording a readout address for the first recording medium, second transient address recording means for transiently recording a write address for the second recording medium, and wherein the control means updates the readout address for the first recording medium and the write address for the second recording medium based upon the control signal.

6. The information transfer system as claimed in claim 1 further comprising:

first transient data recording means for transiently recording the information read out from the first recording medium, second transient data recording means for transiently recording the information to be written on the second recording medium, and wherein the control means validates the first transient data recording means and the second transient data recording means based upon the control signal.

7. The information transfer system as claimed in claim 4 further comprising:

first transient address recording means for transiently recording a readout address for the first recording medium, second transient address recording means for transiently recording a write address for the second recording medium, and wherein the control means updates a readout address for the first recording medium and a write address for the second recording medium based upon the readout signal for the first recording medium.

8. The information transfer system as claimed in claim 7 wherein the control means updates the readout address for the first recording medium and the write address for the second recording medium based upon a transition portion of the readout signal for the first recording medium from an active state to an inactive state.

9. The information transfer system as claimed in claim 1 wherein at least one of the first recording medium and the second recording medium is a semiconductor memory.

10. The information transfer system as claimed in claim 9 wherein the semiconductor memory is a non-volatile memory.

11. An information transfer device for transferring information recorded on a recording medium comprising:

a first recording medium for recording the information thereon;

an external recording medium having a second recording medium;

transmission means for transmitting the information recorded on the first recording medium to the second recording medium;

a central processing unit for providing a control signal;

a control unit for receiving the control signal and for simultaneously causing a readout signal from the first recording medium and a write signal to the second recording medium to be generated, wherein information is transferred directly from the first recording medium to the second recording medium; and first transient address recording means for transiently recording a readout address for the first recording medium, the external recording medium including a second transient address recording means for transiently recording a write address for the second recording medium, wherein the transmission means receives the information in response to the readout signal, wherein the second recording medium receives the information transferred from the transmission means in response to the write signal, and wherein the control unit updates the readout and the write addresses based upon the control signal.

12. An information transfer device for transferring information recorded on a recording medium comprising:

a first recording medium for recording the information thereon;

an external recording medium having a second recording medium;

transmission means for transmitting the information recorded on the first recording medium to the second recording medium;

a central processing unit for providing a control signal;

a control unit for receiving the control signal and for simultaneously causing a readout signal from the first recording medium and a write signal to the second recording medium to be generated, wherein information is transferred directly from the first recording medium to the second recording medium; and first transient data recording means for transiently recording the information read out from the first recording medium, the external recording medium including second transient data recording means for transiently recording the information read out from the first recording medium, wherein the transmission means receives the information in response to the readout signal, wherein the second recording medium receives the information transferred from the transmission means in response to the write signal, and wherein the control unit validates the first transient recording means and the second transient recording means based upon the control signal.

13. An information transfer device for transferring information recorded on a recording medium, comprising:

a first recording medium for recording the information thereon;

an external recording medium having a second recording medium;

transmission means for transmitting the information recorded on the first recording medium to the second recording medium;

a central processing unit for providing a control signal;

a control unit for receiving the control signal and for simultaneously causing a readout signal from the first recording medium and a write signal to the second recording medium to be generated, wherein information is transferred directly from the first recording medium to the second recording medium; and first transient address recording means for transiently recording a readout address for the first recording medium, the external recording medium including second transient address recording means for transiently recording a write address for the second recording medium, wherein the transmission means receives the information in response to the readout signal, wherein the second recording medium receives the information transferred from the transmission means in response to the write signal, wherein the control signal is the readout signal for the first recording medium and wherein the control unit generates the write signal for the second recording medium based upon the readout signal for the first recording medium, and wherein the control unit updates the readout address for the first recording medium and the write address for the second recording medium based upon the readout signal for the first recording medium.

14. The information transfer device as claimed in claim 13 wherein the control unit updates the readout address for the first recording medium and the write address for the second recording medium based upon a transition portion of the readout signal for the first recording medium from an active state to an inactive state.

15. A method of transferring information from a first recording medium to a second recording medium, the method comprising the steps of:

determining a transfer origin address of information to be transferred from a first recording medium;

outputting the transfer origin address for the first recording medium on a transmission means for transmitting the information recorded on the first recording medium to the second recording medium;

determining a transfer destination address of a second recording medium to which the information is to be transferred and recorded thereon;

outputting the transfer destination address for the second recording medium on the transmission means;

transiently recording to a first transient address recording unit, the transfer origin address read out from the first recording medium;

transiently recording to a second transient address recording unit, the transfer destination address at which the information is to be written on the second recording medium;

fetching the information to be transferred from the first recording medium;

generating a readout signal for recording from the first recording medium while simultaneously generating a write signal for writing to the second recording medium; and reading out information from the first recording medium while simultaneously writing the information to the second recording medium, thereby rapidly transferring the information from the first recording medium to the second recording medium via the transmission means.

16. The method of claim 15, wherein the readout signal for the first recording medium and the write signal for the second recording medium are based upon the readout signal for the first recording medium.

17. The method of claim 15, further comprising the steps of:

generating a control signal, wherein the step of generating the readout signal for reading from the first recording medium while simultaneously generating a write signal for writing to the second recording medium is in response to the control signal, and updating the transfer origin address read out from the first recording medium and the transfer destination address for the second recording medium based upon the control signal.

18. The method of claim 17, further comprising the steps of:

transiently recording the information read out from the first recording medium to a first transient data recording means;

transiently recording t he information to be written on the second recording medium to a second transient data recording means; and validating the first and second data recording means based upon the control signal.

19. The method of claim 17, further comprising the step of:

updating the transfer origin address for the first recording medium and the transfer destination address for the second recording medium based upon a transition portion of the readout signal for the first recording medium from an active state to an inactive state.

20. A method of transferring information from a first recording medium to a second recording medium, the method comprising the steps of:

selecting a transfer function of an information transfer device to transfer information from a first recording medium to an external recording medium;

determining a transfer origin address of information to be transferred from a first recording medium;

outputting the transfer origin address on transmission means for transmitting the information recorded on the first recording medium to the external recording medium, at a first address port for the first information recording medium;

transiently recording the transfer origin address read out from the first recording medium to a first transient address recording unit;

determining a transfer destination address of the external recording medium to which the information is to be transferred;

outputting the transfer destination address on the transmission means at a second address port for the external recording medium;

transiently recording the transfer destination address of the external recording medium to which the information is to be written;

fetching the information to be transferred to the external recording medium from a third address port for the first recording medium;

transiently recording the information read out from the first recording medium in a transient data recording means;

generating a readout signal for reading from the first recording medium while simultaneously generating a write signal for writing to the second recording medium; and reading out information from the first recording medium while simultaneously writing the information to the second recording medium, thereby rapidly transferring the information from the first recording medium to the second recording medium via the transmission means.

* * * * *